US008779769B2

(12) United States Patent
Ritter

(10) Patent No.: US 8,779,769 B2
(45) Date of Patent: *Jul. 15, 2014

(54) METHOD AND SYSTEM FOR DETERMINING A MAGNETIC RESONANCE SYSTEM ACTIVATION SEQUENCE

(75) Inventor: Dieter Ritter, Fürth (DE)

(73) Assignee: Siemens Aktiengesellschaft, München (DE)

( * ) Notice: Subject to any disclaimer, the term of this patent is extended or adjusted under 35 U.S.C. 154(b) by 340 days.

This patent is subject to a terminal disclaimer.

(21) Appl. No.: 13/198,348

(22) Filed: Aug. 4, 2011

(65) Prior Publication Data

US 2012/0194185 A1 Aug. 2, 2012

(30) Foreign Application Priority Data

Aug. 4, 2010 (DE) .......................... 10 2010 033 329

(51) Int. Cl.
*G01V 3/00* (2006.01)

(52) U.S. Cl.
USPC ........................................................ 324/309

(58) Field of Classification Search
USPC .................................................. 324/300–322
See application file for complete search history.

(56) References Cited

U.S. PATENT DOCUMENTS

| 7,843,195 | B2 * | 11/2010 | Ruhm | 324/309 |
| 8,542,013 | B2 * | 9/2013 | Mößnang et al. | 324/309 |
| 2008/0238425 | A1 | 10/2008 | Xu et al. | |
| 2009/0069664 | A1 | 3/2009 | Kim et al. | |
| 2009/0102483 | A1 | 4/2009 | Zhai et al. | |
| 2009/0273345 | A1 * | 11/2009 | Ruhm | 324/309 |
| 2011/0254546 | A1 * | 10/2011 | Ritter | 324/307 |
| 2013/0253876 | A1 * | 9/2013 | Pfeuffer et al. | 702/123 |

FOREIGN PATENT DOCUMENTS

DE 10 2010 013 672 A1 10/2011

OTHER PUBLICATIONS

German Office Action dated Jun. 25, 2011 for corresponding German Patent Application No. DE 10 2010 033 329.8 with English translation.
D. Lee et al., "Time-Optimal Design for Multidimensional and Parallel Transmit Variable-Rate Selective Excitation", Magnetic Resonance in Medicine 61, pp. 1471-1479, 2009.

* cited by examiner

*Primary Examiner* — Dixomara Vargas
(74) *Attorney, Agent, or Firm* — Lempia Summerfield Katz LLC

(57) ABSTRACT

A method and control sequence determination facility for determining a magnetic resonance system activation sequence that includes a multichannel pulse train with a plurality of individual HF-pulse trains to be emitted by the magnetic resonance system via different independent high-frequency transmit channels of a transmit facility in a parallel manner are described. The multichannel pulse train is calculated based on a k-space gradient trajectory and a predetermined target magnetization using an HF pulse optimization method. In the HF pulse optimization method, optimization of the multichannel pulse train and/or the k-space gradient trajectory takes account of at least one hardware operating parameter of the transmit facility.

21 Claims, 6 Drawing Sheets

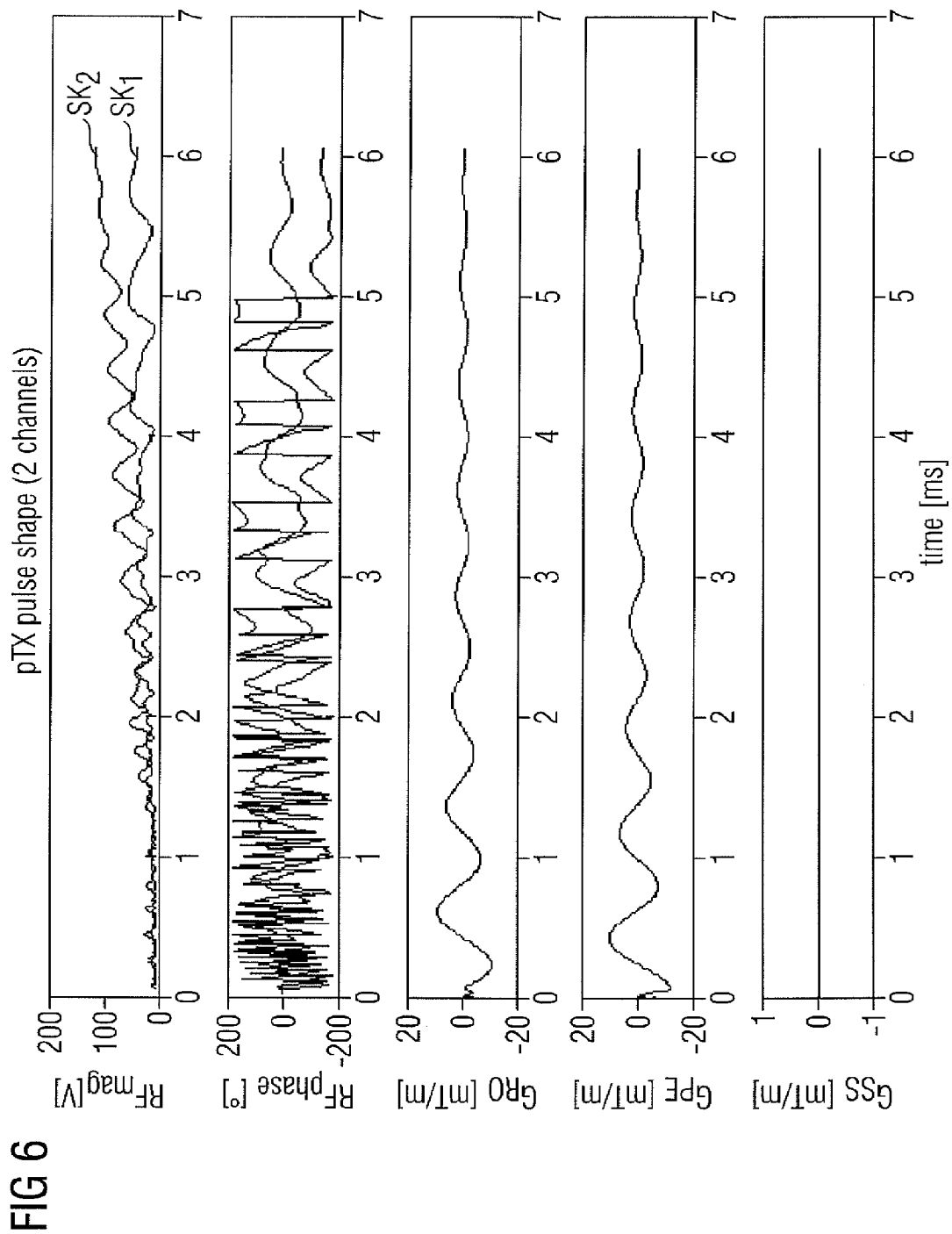

METHOD AND SYSTEM FOR DETERMINING A MAGNETIC RESONANCE SYSTEM ACTIVATION SEQUENCE

This application claims the benefit of DE 10 2010 033 329.8, filed on Aug. 4, 2010.

BACKGROUND

The present embodiments relate to a method and a control sequence determination facility for determining a magnetic resonance system activation sequence.

In a magnetic resonance system, a body to be examined may be exposed with the aid of a basic magnetic field system to a relatively large basic magnetic field of 3 or 7 Tesla, for example. A gradient system is also used to apply a magnetic field gradient. High-frequency excitation signals (HF signals) are emitted via a high-frequency transmit system using suitable antenna facilities to provide that nuclear spins of certain atoms excited in a resonant manner by the high-frequency field are flipped through a defined flip angle in relation to the magnetic field lines of the basic magnetic field. This high-frequency excitation or the resulting flip angle distribution is also referred to in the following as nuclear magnetization or magnetization for short. As the nuclear spins relax, high-frequency signals (e.g., magnetic resonance signals) are emitted, received using suitable receive antennas and further processed. Raw data thus acquired may be used to reconstruct desired image data. The high-frequency signals for nuclear spin magnetization may be emitted using a whole-body coil or a body coil. A structure for this is a birdcage antenna that includes a plurality of transmit rods that are disposed around a patient space of the tomography system where the patient is examined, parallel to the longitudinal axis.

Whole-body antennas may be operated in a homogeneous mode (e.g., a CP mode). A single temporal HF signal is output to all the components of the transmit antenna (e.g., all the transmit rods of a birdcage antenna). In this process, the pulses are optionally sent to the individual components with a phase offset with a displacement matched to the geometry of the transmit coil. For example, in the case of a birdcage antenna with 16 rods, the rods are each activated with the same HF signal offset by 22.5° phase displacement.

With more recent magnetic resonance systems, individual HF signals adjusted for imaging may be applied to the individual transmit channels that are assigned, for example, to the individual rods of the birdcage antenna. A multichannel pulse train that includes a plurality of individual high-frequency pulse trains that may be emitted in a parallel manner by way of the different independent high-frequency transmit channels, is emitted. The multichannel pulse train (e.g., a pTX pulse due to the parallel emission of the individual pulses) may be used as an excitation, refocusing and/or inversion pulse. In this process, homogenous excitation may be replaced with, for example, any manner of excitation in the measurement chamber and also in the patient.

The multichannel pulse trains may be generated beforehand for a certain planned measurement. The individual HF pulse trains (e.g., the HF trajectories) for the individual transmit channels are determined over time as a function of a k-space gradient trajectory using an HF pulse optimization method. The transmit k-space gradient trajectory (e.g., a k-space gradient trajectory or gradient trajectory) is locations in the k-space approached by setting the individual gradients at certain times. The k-space is the spatial frequency space, and the gradient trajectory in the k-space describes a path, on which the k-space is traveled over time when an HF pulse or the parallel pulses are emitted by corresponding switching of the gradient pulses. Setting the gradient trajectory in the k-space (e.g., setting the appropriate gradient trajectory applied parallel to the multichannel pulse train) makes it possible to determine spatial frequencies, at which certain HF energies are deposited. When defining a gradient trajectory, it is provided that relevant regions in the k-space are also traveled. For example, if a region that is clearly defined in the spatial space (e.g., a rectangle or oval) is to be excited, the k-space is also effectively covered in an outer limit region. If, in contrast, only a less defined limit is required, coverage in the central k-space region is adequate.

The user also predetermines a target magnetization (e.g., a desired flip angle distribution) to plan the HF pulse sequence.

A suitable optimization program is used to calculate the appropriate HF pulse sequence for the individual channels so that the target magnetization is achieved. One method for designing the multichannel pulse trains in parallel excitation methods is described, for example, in W. Grishom et al., "Spatial Domain Method for the Design of RF Pulses in Multicoil Parallel Excitation," Mag. Res. Med. 56, 620-629, 2006.

For a certain measurement, the different multichannel pulse trains to be emitted via the different transmit channels of the transmit facility, the gradient pulse train (with appropriate x-, y- and z-gradient pulses) to be emitted in a manner coordinated thereto, and further control requirements are defined in a measurement protocol. The measurement protocol is created beforehand and retrieved for a certain measurement from a memory, for example, and may, in some instances, be changed locally by the operator. During the measurement, the magnetic resonance system is controlled fully automatically based on this measurement protocol, with the control facility of the magnetic resonance system reading the commands out of the measurement protocol and processing the read out commands.

The "optimum" individual HF pulses of the multichannel pulse trains determined within the optimization method are each complex-value voltage sequences in a time grid of 10 μs and less for each individual independent transmit channel. In practice, the pulse lengths may be, for example, between 2 and 30 ms. Within the optimization methods, which may operate using a Bloch simulation method, these functions may be determined with a high level of quality. The results are numerically stable and mathematically optimal so that target magnetizations with any spatial form may also be generated in the simulations. For individual HF pulses, the individual successive voltage values act in a very non-coherent manner. The curvature behavior of the voltage profile and the phase profile is more like a random function than a constantly differentiable function. This gives rise to the problem that such a function may not be applied with any precisely reproducible quality due to limitations in the transmit hardware (e.g., due to a limited sampling rate). During actual emission of the multichannel pulse trains, target magnetization is not achieved with the required precision (e.g., with respect to a spatial distribution and homogeneity), even though the calculated multichannel pulse trains should supply this quality.

SUMMARY AND DESCRIPTION

The present embodiments may obviate one or more of the drawbacks or limitations in the related art. For example, a method and a corresponding control sequence determination device for determining magnetic resonance system activation sequences may be provided.

In one embodiment of the method, a multichannel pulse train is calculated based on a k-space gradient trajectory and a predetermined target magnetization using an HF pulse optimization method. Optimization of the multichannel pulse train and/or of the k-space gradient trajectory takes account of at least one hardware operating parameter of the transmit facility. In other words, if, for example, the individual transmit channels of the transmit facility have a limitation with respect to one of hardware operating parameters, optimization of the multichannel pulse train or k-space gradient trajectory takes place in such a manner that the multichannel pulse train may be emitted, where possible, without exceeding the limitation or is only influenced insignificantly by the limitation.

This may be achieved by optimizing the multichannel pulse train and by optimizing the k-space gradient trajectory, since the multichannel pulse train and the k-space gradient trajectory predetermine times at which HF pulses are to be emitted. The k-space gradient trajectory may also be used to influence the HF pulse trains, so that emission is not too greatly influenced by the limitation of the operating parameters of the transmit facility.

If optimization of the k-space gradient trajectory is to take place, no fixed k-space gradient trajectory is predetermined in the usual manner; only an initial k-space gradient trajectory in the form of a parameterizable function is determined. These parameters may be varied in the optimization method to modify the k-space gradient trajectory within the context of a predetermined initial basic form.

Different hardware operating parameters with respect to the limitation, of which optimization of the multichannel pulse train and/or the k-space gradient trajectory is possible, and different possibilities for taking the different hardware operating parameters into account within the HF pulse optimization method are described in more detail below.

Test results have shown that taking account of the hardware operating parameters of the transmit facility to be used later in the optimization method results in the calculation of multichannel pulse trains and k-space gradient trajectories that produce excellent results in the simulation and later achieve the desired excitation profile easily in the examination object during practical emission.

In one embodiment, a control sequence determination facility is configured so that the control sequence determination facility takes account of at least one hardware operating parameter of the transmit facility during optimization of the multichannel pulse train and/or the k-space gradient trajectory in the HF pulse optimization method. For example, an input interface may also be configured in a suitable manner to take in information about the hardware operating parameters to be taken into account, basic conditions, or target function terms that reflect the limitation of the relevant operating parameter to be taken into account during optimization.

In one embodiment of a method for operating a magnetic resonance system, an activation sequence is determined, and the magnetic resonance system is operated using this activation sequence. One embodiment of the magnetic resonance system has a control sequence determination facility as described above.

Parts of the control sequence determination facility may be configured in the form of software components. This is true, for example, of the HF pulse optimization unit. The input interface may, for example, be a user interface (e.g., a graphical user interface) for the manual inputting of the k-space gradient trajectory and a target magnetization (optionally, also hardware limit values). The input interface may also be an interface for selecting and taking data from a data memory disposed within the control sequence determination facility or connected to the control sequence determination facility by way of a network (optionally, also using the user interface). The control sequence output interface may be, for example, an interface that transmits the control sequence to a magnetic resonance controller in order to control the measurement directly and may also be an interface that sends the data via the network and/or stores the data in a memory for later use. These interfaces may also be configured at least partially in the form of software and may access hardware interfaces of an existing computer.

The present embodiments include a computer program that may be loaded directly into a memory of a control sequence determination facility, with program code segments or instructions on a non-transitory medium to execute the acts of one embodiment of the method described above when the program is run in the control sequence determination facility. Such a software-based implementation has the advantage that previous facilities used to determine control sequences (e.g., suitable computers in computer centers of the magnetic resonance system manufacturer) may also be modified appropriately by implementing the program in order to determine the control sequences associated with a lower high-frequency load.

It may be problematic that the operating parameters of the transmit hardware are limited with respect to an achievable curvature of the voltage curves of the HF pulse trains. Optimization may take place with respect to the curvature of the voltage curve of an HF pulse train. A further restriction is the bandwidth of the HF hardware. It is known that every HF transmit system has a limit frequency, up to which frequencies may be processed. Optimization may also take place with respect to the bandwidth of a Fourier-transformed HF pulse train in order to also be able to take account of this bandwidth restriction of the transmit hardware.

Different embodiments exist for taking account of the restriction of the hardware operating parameter in the context of the HF pulse optimization method. For example, a target function may be predetermined within the HF pulse optimization method. The HF pulse optimization method includes at least one function term that takes direct or indirect account of the hardware operating parameter of the transmit facility. More detailed examples of this are set out below.

Alternatively or additionally, the optimization may take account of a basic condition that corresponds to a limitation of the hardware operating parameter of the transmit facility.

The k-space gradient trajectory may also be optimized. A parameterizable k-space gradient trajectory is predetermined as the initial basic form that may be adjusted within the optimization method.

Geometric parameters of the k-space gradient trajectory may be minimized within the HF pulse optimization method. In one embodiment, the geometric parameters include parameters for determining a geometric design of echo planar imaging (EPI) trajectories and/or spoke position and/or spiral geometries and/or radial geometries and/or free form geometries.

For example, the gradient trajectory may be predetermined as a spiral with two variable parameters. An original linear enlargement of a radius with an Archimedes spiral may be set as variable using a function (e.g., a 2 point spline). The variable geometric parameters allow the spread of the spiral in the x direction and y direction and a gap between two adjacent tracks within the spiral to be influenced.

With a spoke geometry in the k-space, only individual points in the k-space are approached one after the other by setting x and y gradients (e.g., ten points on a spiral). To maintain an approached x/y position in the k-space, the x gradient and y gradient are respectively set. In other words, no more pulses are applied in the x gradient and y gradient directions. Instead, during the emission of the high-frequency pulses, a z gradient is switched to measure the relevant location in the k-space in a slice-selective manner. With such a measuring method, the x and y positions of the spokes may be set in the k-space by appropriate selection of the geometric parameters.

Radial geometries may be, for example, rosette geometries, and free form geometries are freely selectable geometries.

Alternatively or additionally, in the HF pulse optimization method, time parameters of the k-space gradient trajectory may be varied. For example, the gradient trajectory may be reparameterized to the extent that at points where, for example, major curvature changes of the HF pulses may be seen, a smoother HF form is achieved using sub-sampling of the gradient trajectories in the same time grid in a repeated optimization process. The form of the k-space gradient trajectory may also stay the same in this process (e.g., the same gradient form departs in the excitation k-space).

In one embodiment, the HF pulse optimization method is performed iteratively in that an optimum multichannel pulse train is determined in each case, taking account of the hardware operating parameter for a given k-space gradient trajectory using the HF pulse optimization method. This may be performed, for example, with a standard HF pulse optimization method (e.g., in that the actual magnetization is matched to a target magnetization or a setpoint magnetization by varying the HF pulse trains to be emitted, for example, using a least-mean-square method). In a further act, parameters of the k-space gradient trajectory are varied taking account of the hardware operating parameter according to a predetermined optimization strategy. A new k-space gradient trajectory is used in further iterations to repeat the abovementioned acts. This takes place until a termination criterion is reached (e.g., until a maximum number of iterations has been gone through, or the target function to be minimized has reached a required minimum or dropped below a predetermined $\in$ value). A more specific exemplary embodiment of this is described further below.

In one embodiment, the multichannel pulse train is calculated first for a lower target magnetization in the context of the HF pulse optimization method. The multichannel pulse train determined in this process is scaled up to a final target magnetization and optionally corrected once more. This procedure utilizes the fact that for low magnetizations (e.g., for small flip angles in a low flip region, between 1° and 5°), magnetization behavior is still linear. Calculation using an optimization method is simpler in this region. When an optimum multichannel pulse train has been found for this region, the optimum multichannel pulse train may be scaled up. If, for example, calculation takes place in the low flip region for a flip angle of maximum $\alpha=5°$, and the actual magnetization is to take place at a flip angle $\alpha$ of maximum 90°, the amplitude values of the HF pulses may be multiplied by a factor 18, for example, according to a flip angle ratio. Any errors that may occur may be determined and corrected as part of a simulation.

The optimization takes account of the hardware operating parameter with respect to optimum adjustment to the target magnetization. In the context of the HF pulse optimization method, optimization of the multichannel pulse train and/or the k-space gradient trajectory is also performed with respect to a local and/or global HF load value for an examination object. A high-frequency load on the patient may be limited, as too high a load may injure the patient.

The high-frequency load on the patient may be calculated beforehand when planning the high-frequency pulses to be emitted, and the high-frequency pulses are selected so that a certain limit is not reached. A measure of the high-frequency load is a specific absorption rate (SAR) value that indicates in Watt/kg a biological load acting on the patient due to a certain high-frequency pulse output. For the global SAR of a patient, a standard limit of 4 Watt/kg, for example, applies at a first level according to the IEC standard. In addition to prior planning, the SAR load on the patient is also monitored continuously during the examination using suitable safety facilities on the magnetic resonance system, and a measurement is modified or terminated if the SAR value is above specified standards. Precise planning beforehand may be conducted to avoid termination of the measurement, as this would require a new measurement.

During the emission of multichannel pulse trains, every possible high-frequency superimposition is investigated to estimate the maximum high-frequency load, as homogeneous excitation may be replaced in a measurement chamber and also in the patient by any form of excitation. This may be tested, for example, on a patient model including tissue-typical properties such as, for example, conductivity, dielectricity, and density in a simulation. It is already known from previous simulations that hot spots may form in the high-frequency field in the patient, at which the high-frequency load may be many times more than values previously known from homogeneous excitation. The resulting high-frequency limitations are unacceptable for the performance of clinical imaging, as, if the hot spots are taken into account, an overall transmit output may be too low to generate acceptable images. It is therefore advantageous to achieve a reduction in the high-frequency load when emitting multichannel pulse trains.

In one embodiment, it is provided that the high-frequency load is also taken into account in the context of the HF pulse optimization method, for example, by setting suitable target functions that represent a local or global load value, and optimization also takes place with respect to the load.

Further parameters with respect to an HF load value of an examination object may also be optimized in the context of the HF pulse optimization method. For example, the parameters used for HF pulse optimization within a Tikhonov regularization or other system parameters such as, for example, a maximum gradient strength or a slew rate (gradient pulse rise time) may also be varied within the context of optimization to achieve even better results.

Also, the gradient trajectory in the context of the predetermined basic form in the optimization method may also be selected so that the HF energy is distributed as far as possible in the k-space to avoid high HF peaks. The HF peaks that do occur increase the effective overall high-frequency output significantly, which in turn dominates the SAR load on the patient.

BRIEF DESCRIPTION OF THE DRAWINGS

FIG. 6 illustrates pulse shapes of excitation pulses for two channels of a multichannel pulse train and associated gradient pulses for an optimization taking account of the limitation of a hardware operating parameter according.

DETAILED DESCRIPTION OF THE DRAWINGS

Figure 1:
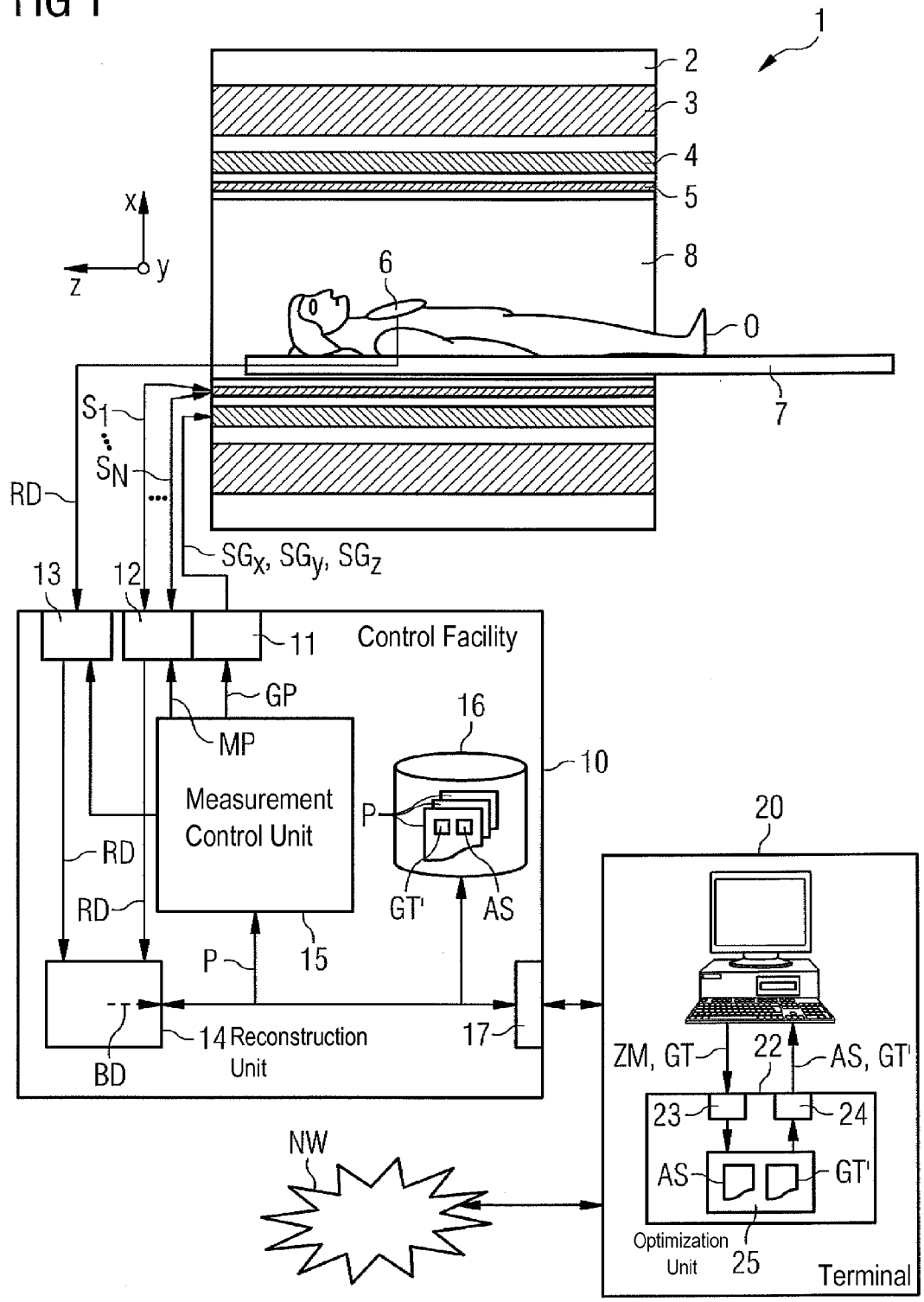
FIG. 1 shows a schematic diagram of one embodiment of a magnetic resonance system.

FIG. 1 shows one embodiment of a magnetic resonance system 1. The magnetic resonance system 1 includes an actual magnetic resonance scanner 2 (e.g., a magnetic resonance scanner) with an examination space 8 or patient tunnel located in the magnetic resonance scanner 2. A couch 7 (e.g., a bed) may be moved into the patient tunnel 8 so that a patient O or subject lying on the couch 7 may be supported during an examination in a certain position within the magnetic resonance scanner 2 relative to a magnet system and a high-frequency system disposed in the magnetic resonance scanner 2. The couch 7 may also be moved between different positions during a measurement.

Components of the magnetic resonance scanner 2 include a basic field magnet 3, a gradient system 4 with magnetic field gradient coils to apply any magnetic field gradients in x, y and z directions, and a whole-body high-frequency coil 5 (or body coil). Magnetic resonance signals induced in the examination object O may be received by way of the whole-body high-frequency coil 5. The body coil 5 is also used to emit high-frequency signals to induce the magnetic resonance signals. The magnetic resonance signals may be received using local coils 6 located, for example, on or below the examination object O. The local coils 6 may be used both to transmit and receive. These components are essentially known to the person skilled in the art and are therefore only shown in outline in FIG. 1.

In the embodiment shown in FIG. 1, the whole-body high-frequency coil 5 is set up in the form of a birdcage antenna and has a number N of individual antenna rods (e.g., individual antenna rods) that run parallel to the patient tunnel 8 and are distributed evenly over the periphery of the patient tunnel 8. The individual antenna rods are each connected capacitively in the manner of a ring at ends.

The individual antenna rods may be activated separately, for example, by a control facility 10 (e.g., a control device) by way of individual transmit channels $S_1, \ldots S_N$. The control facility 10 may be a control computer that may also consist of a plurality of individual computers. In one embodiment, the plurality of individual computers may be spatially separated and connected to one another by way of suitable cables or the like.

The control facility 10 is connected to a terminal 20 by way of a terminal interface 17. An operator may activate the entire magnetic resonance system 1 via the terminal interface 17. In one embodiment, the terminal 20 is equipped in the manner of a computer with a keyboard, one or more screens and further input devices (e.g., a mouse or the like) so that the operator has a graphical user interface.

The control facility 10 has, for example, a gradient control unit 11 that may include a number of subcomponents. The individual gradient coils are connected to control signals $SG_x$, $SG_y$, $SG_z$ by way of the gradient control unit 11. The control signals are gradient pulses that are positioned, during a measurement, in precisely specified temporal positions and with a precisely predetermined temporal profile.

The control facility 10 also has a high-frequency transmit/receive unit 12. The HF transmit/receive unit 12 also includes a number of subcomponents in order to emit high-frequency pulses separately and in a parallel manner for the individual transmit channels $S_1, \ldots S_N$ (e.g., to the individually activatable antenna rods of the body coil 5). Magnetic resonance signals may also be received by way of the transmit/receive unit 12. This may be done with the aid of the local coils 6. Raw data RD received using the local coils 6 is read out and processed by a further HF transmit/receive unit 13. The magnetic resonance signals received herefrom or from the whole-body coil 5 using the HF transmit/receive unit 12 are transmitted as raw data RD to a reconstruction unit 14 that reconstructs the image data BD therefrom and stores the reconstructed image data BD in a memory 16 and/or transmits the reconstructed image data BD to the terminal 20 via the interface 17, so that the operator may view the reconstructed image data BD. The image data BD may also be stored and/or displayed and evaluated at other points via a network NW.

The gradient controller 11, the HF transmit/receive unit 12 for the body coil 5, and the HF transmit/receive unit 13 for the local coils 6 are each coordinated and activated by a measurement control unit 15. This provides that, by corresponding commands, a desired gradient pulse train GP is emitted using suitable gradient control signals $SG_x$, $SG_y$, $SG_z$, and the HF control unit 12 is activated parallel thereto so that a multichannel pulse train MP is emitted. In other words, the appropriate high-frequency pulses are transmitted in a parallel manner to the individual transmit rods of the whole-body coil 5 on the individual transmit channels $S_1, \ldots S_N$. The magnetic resonance signals are read out at the local coils 6 and further processed at the appropriate time by the HF transmit/receive unit 13, or any signals at the whole-body coil 5 are read out and further processed at the appropriate time by the HF transmit/receive unit 12. The measurement control unit 15 predetermines the corresponding signals (e.g., the multichannel pulse train MP to the high-frequency transmit/receive unit 12 and the gradient pulse train GP to the gradient control unit 11) according to a predetermined control protocol P. Control data that is to be set during a measurement is stored in the control protocol P.

A plurality of control protocols P for different measurements may be stored in a memory 16. The plurality of control protocols P may be selected and optionally varied by the operator via the terminal 20 in order to have an appropriate control protocol P for the currently desired measurement, with which the measurement control unit 15 may operate. The operator may also retrieve control protocols (e.g., control protocols of a manufacturer of the magnetic resonance system) via the network NW and modify and use the control protocols as required.

The basic sequence of a magnetic resonance measurement and the cited components for activation are known to the person skilled in the art, so the basic sequence and the cited components will not be discussed in detail. The magnetic resonance scanner 2 and the associated control device may also have a plurality of further components that are also not described in detail.

The magnetic resonance scanner 2 may also be set up differently (e.g., with a laterally open patient space), and the high-frequency whole-body coil may not be in the form of a birdcage antenna. The HF transmit/receive unit 12 with the body coil 5 and the HF transmit/receive unit 13 with the local coils 6 may each be transmit facilities (e.g., transmit devices) in the above example according to FIG. 1. It is provided that the transmit facility has a number of separately activatable transmit channels $S_1, \ldots S_N$.

FIG. 1 also shows a schematic illustration of one embodiment of a control sequence determination system 22 (e.g., a control sequence determination device) that determines a magnetic resonance system activation sequence AS. For a specific measurement, the magnetic resonance system activation sequence AS contains, for example, a predefined multichannel pulse train MP to activate the individual transmit channels $S_1, \ldots S_N$. The magnetic resonance system activation sequence AS is created as part of the measurement protocol P, for example.

The control sequence determination facility 22 is illustrated in FIG. 1 as part of the terminal 20 and may be implemented in the form of software components on the computer of the terminal 21. The control sequence determination facility 22 may also be part of the control facility 10 or be implemented on a separate computation system, and the finished activation sequences AS are transmitted via the network NW to the magnetic resonance system 1 (e.g., optionally as part of a complete control protocol P).

The control sequence determination facility 22 has, for example, an input interface 23. Via the input interface 23, the control sequence determination facility 22 receives a target magnetization ZM that predetermines the nature of a flip angle distribution during the desired measurement. A k-space gradient trajectory GT is also predetermined.

The target magnetization ZM and the k-space trajectory GT are set, for example, by an expert trained to design control protocols for certain measurements. The data thus obtained is transmitted to an HF pulse optimization unit 25 that automatically creates a certain activation sequence AS with an optimum multichannel pulse train MP to achieve the desired target magnetization ZM. As described below, the gradient trajectory GT may also be modified in this process (e.g., a modified gradient trajectory GT' is generated). This data is output again via a control sequence output interface 24 and may be transmitted to the control facility 10 (e.g., in the context of a control protocol P), in which further requirements for activating the magnetic resonance system 1 are indicated (e.g., parameters for reconstructing images from the raw data).

The sequence of such a method for determining a magnetic resonance system activation sequence AS is described below with reference to the flow diagram according to FIG. 2, using a simple example.

In act I, the target magnetization ZM and a gradient trajectory GT are predetermined. In other words, a gradient pulse sequence for the departure of the gradient trajectory GT is defined.

In act II, the multichannel pulse train is designed automatically. In this process, the individual HF pulse sequences are designed for the different transmit channels (e.g., which HF pulse shape is to be sent on which channel is precisely calculated). This takes place for a low flip region with flip angles below 5°, since in this region, the magnetization behavior is still linear. An iterative optimization method may be used, as the iterative optimization method may be particularly suitable. The Finite Differences Method may be used, for example. Other optimization methods that are not iterative may also be used. With the method known to date, the optimization method is such that, for example, the square mean deviation (least mean square) between the target magnetization and the actual magnetization is minimized. In other words, the following solution is sought:

$$b = \arg_b \min(\|m_{act} - m_{targ}\|^2) = \arg_b \min(\|A \cdot b - m_{targ}\|^2) \quad (1)$$

The term in brackets in equation (1) is the target function ZF, which may be predetermined for act II. Here, $m_{act} = A' b$ is the actual magnetization, where A is the design matrix and b the vector of the HF curves Mt) to be emitted in parallel. $m_{targ}$ is the target magnetization. When the solution to equation (1) is found, the result is a function $b_c(t)$ of the amplitude as a function of time for all transmit channels present. In other words, N functions are obtained (e.g., one function $b_c(t)$ for each channel c=1 to N).

With many methods, the Thikonov regularization is used to extend the target function, solutions for $b_c(t)$ being preferred that have the smallest possible HF amplitude values, since the voltages are squared in the output power calculation. Equation (1) with a target function ZF extended by the Thikonov regularization then appears as follows:

$$b = \arg_b \min(\|A \cdot b - m_{targ}\|^2 + \beta^2 \|b\|^2) \quad (2)$$

The factor $\beta$ is the Thikonov parameter, the setting of which allows a decision to be made between the homogeneity of the flip angle and a large SAR.

After act II at the end of the optimization method, a multichannel pulse sequence $MP_L$ is obtained for the low flip region. The multichannel pulse sequence $MP_L$ is scaled up in act III to achieve the actually desired target magnetization (e.g., not in a flip angle region of 5° but goes up to a flip angle of 90° or more). This is done by multiplying the amplitudes of the individual pulses by the desired scaling factor.

In an optional act IV, error that may occur during scaling up is corrected by a partial Bloch simulation. The partial Bloch simulation is performed at individual times within the pulse sequence. In this process, while applying the Bloch equations, the data for the respective HF time, for which the adjustment is to take place, is tested in a simulator by applying the Bloch equations. The achieved magnetization is thus calculated. Improvements to the requirements for the target magnetization may be found, and corresponding minor corrections may be made by modifying the high-frequency pulse sequences.

In optional act V, all the parameters found are tested again using a temporally complete Bloch simulation. Whether the magnetization achieved with the parameters actually corresponds to the target magnetization may be tested, for example.

In both act IV and act V, the same target function ZF may be used as in act II.

Figure 3:
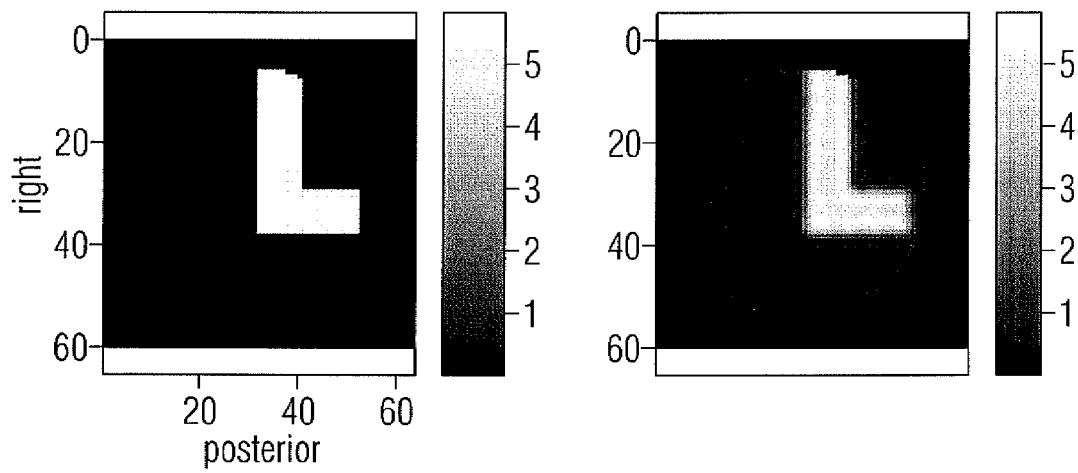
FIG. 3 illustrates results of a Bloch simulation of actual magnetization (right) achieved with an optimized gradient compared with a setpoint magnetization (left)

This method may be used to generate any magnetization patterns with the aid of the pTX pulses. FIG. 3 shows an example of a target magnetization in the form of an L pattern. The target magnetization (left side) is compared, for example, with a simulated actual magnetization (right side). In other words, the result shown on the right side would theoretically be achieved by transmitting the pulses optimized using the abovementioned method. The figures all show a slice through a phantom in the patient coordinate system, with the bottom of the images corresponding to the rear of the patient, and the right side of the patient being located on the left side of the images. The scales in each instance are the pixel numbers. The images show how the desired target magnetization may be achieved in theory with the aid of the optimization method described above.

As mentioned above, the pulse shapes of the optimum multichannel pulse trains found using this optimization method may be simulated in a reproducible manner with great difficulty due to hardware limitations.

Figure 4:
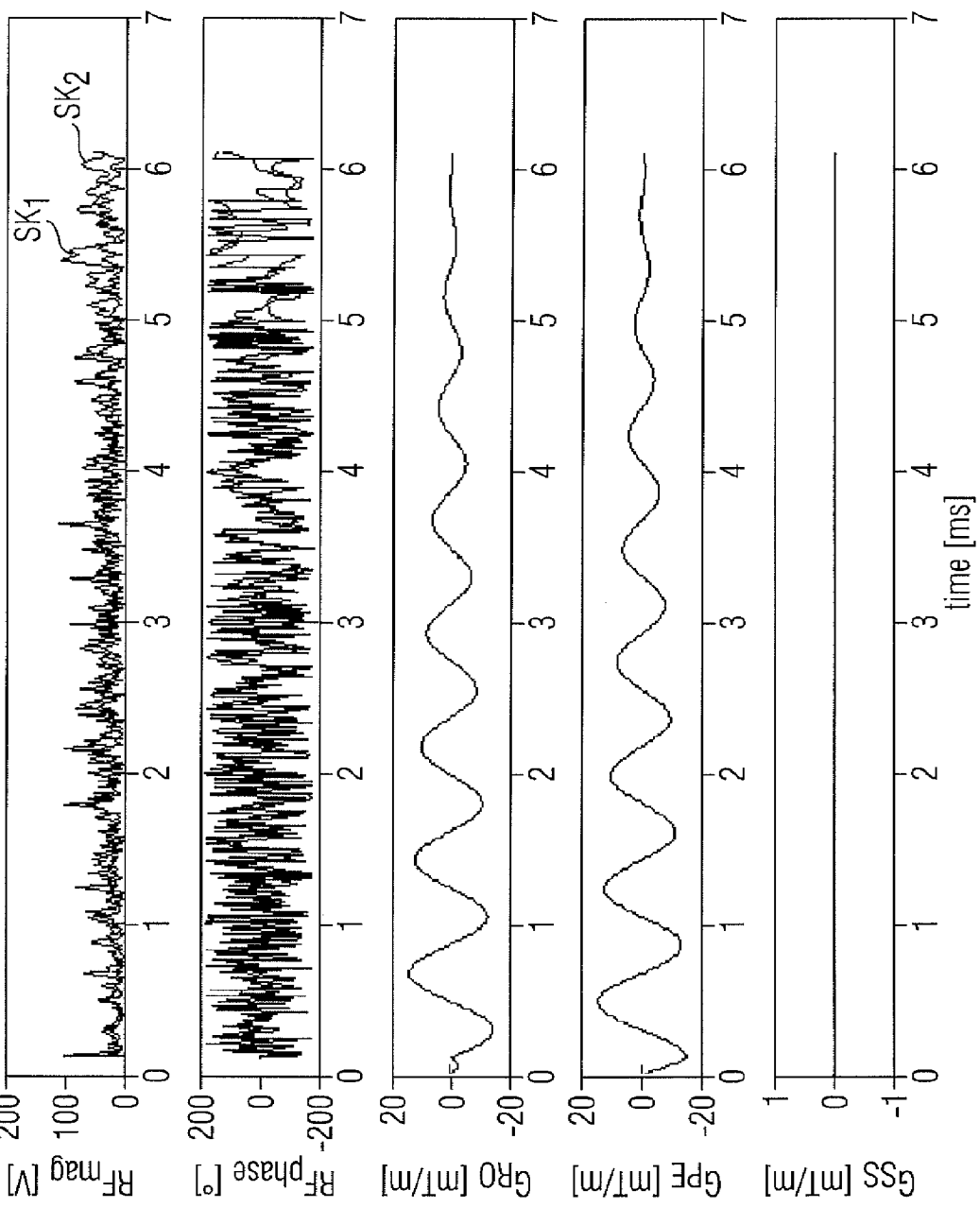
FIG. 4 illustrates pulse shapes of excitation pulses for two channels of a multichannel pulse train and associated gradient pulses in the case of optimization without taking account of a limitation of a hardware operating parameter.

In the top diagram in FIG. 4, voltage curve profiles (in V) over time (in ms) are shown from a pTX pulse train for the L pattern by way of example for two different channels. In the second diagram from the top, phase profiles (in °) over time for curves $SK_1$, $SK_2$ are shown. In the three diagrams below, the gradient pulses to be emitted in a synchronized manner for this purpose are shown respectively in the read out direction ($G_{RO}$; RO=Read Out), in the phase encoding direction ($G_{PE}$; PE=Phase Encoding) and the slice selection direction ($G_{SS}$; SS=Slice Selection) in mT/m. The read out direction is, for example, the x direction, and the phase encoding direction is, for example, the y direction. Since no slice selection has to take place with this example, no gradient pulse is emitted in the slice selection direction (e.g., the z direction).

Figure 5:
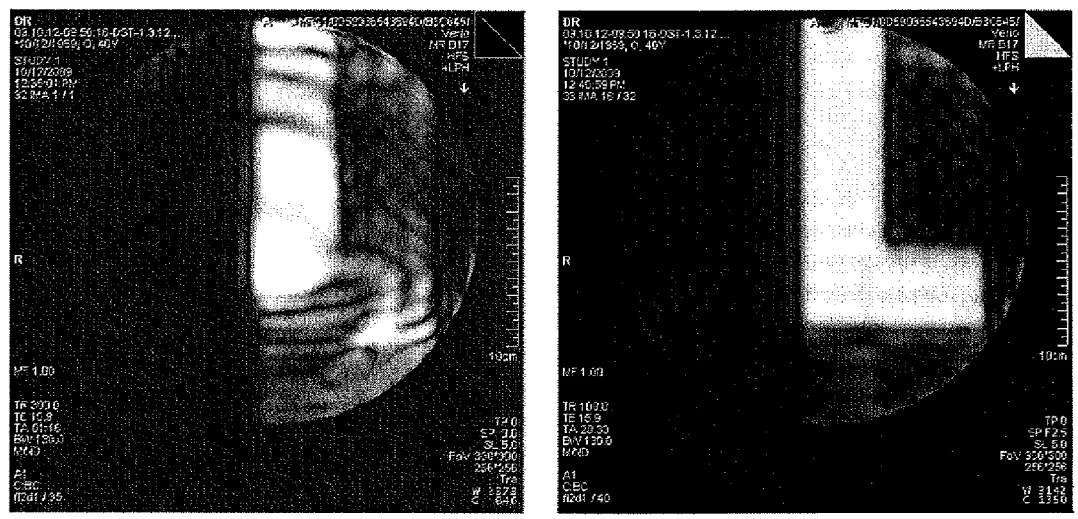
FIG. 5 illustrates results of an actual magnetization achieved in an experiment in a phantom with an optimized multichannel pulse train.

As shown by the upper diagram, for example, the voltage curve profiles are subject to very rapid and tight curvature. This gives rise to the problem described above that when using such a function as a requirement for emitting pulses using "standard" lower cost transmit hardware that is not specifically configured to emit such complicated pulses, the actual excitation result is much poorer in reality than in the simulation. If transmit hardware, as is generally available in magnetic resonance systems, is used to emit an activation sequence found using the optimization method described above to generate the L-shaped target magnetization illustrated in FIG. 3 to excite a phantom correspondingly, this produces unwanted distortions, as is shown, for example, in FIG. 5 on the left side of the image.

To avoid this problem, correspondingly more expensive hardware that may also emit such difficult pulses may be used. Transmit hardware currently used in magnetic resonance devices is of very good quality and is therefore expensive. Equipping an MR device with even more expensive hardware that may also have to be available in a multiple fashion (e.g., for a plurality of transmit channels) may therefore result in even higher costs that may not be acceptable for standard magnetic resonance devices outside the research field.

In one embodiment, hardware operating parameters of the transmit facility or of the individual transmit channels of the transmit facility may be accounted for directly during optimization of the HF pulses. Multichannel pulse trains are found during optimization. This achieves the desired target magnetization very effectively, and the multichannel pulse trains are of such a shape that the multichannel pulse chains may also be emitted with the performance provided by the transmit hardware. In other words, the optimized magnetic resonance system activation sequences may also be sent on a standard magnetic resonance system.

There are various possibilities for this. In one embodiment, the target function, which has a term that takes into account a limitation of the hardware operating parameter (e.g., a sampling rate), may be modified to a certain extent. In act II, the limited hardware operating parameters $HW_L$ that are to be taken into account during optimization may also be predetermined. This may be done indirectly by, for example, influencing a function parameter of the determined HF pulses that cannot be implemented due to the hardware limitation. In one embodiment, the curvature behavior of the individual high-frequency pulses may be influenced, and it is provided that the curvature does not become too marked or rapidly changing.

This is possible by adding a new term, for example, to the target function according to equation (2):

$$b = \arg_b \min(\|A \cdot b - m_{targ}\|^2 + \beta^2 \|b\|^2 + \eta_1 \kappa) \quad (3)$$

Here, $\eta_1$ is a weighting factor, and $\kappa$ a vector that contains the curvatures $\kappa_c$ of the individual functions $b_c$ according to $$\kappa_c = \left| \frac{d^2 b_c}{ds_c^2} \right|. \quad (4)$$

c is the transmit channel index and $s_c$ the arc length of the functions $b_c$. Equation (4) is the standard definition of the curvature of a function as the second derivation after the arc length.

The additional term in equation (3) provides that during optimization, functions $b_c$ with a smaller curvature are preferred, and functions $b_c$ with a greater curvature are suppressed.

Another possibility for influencing curvature behavior during optimization is, for example, to determine the individual functions $b_c$ first without taking account of the curvature in a first optimization pass. From these functions $b_c$, a variant $\underline{b}_c$ (e.g., a filtered or smoothed function) that is better with respect to curvature behavior may be determined (e.g., by suitable filtering (as with a Gaussian or median filter)). The deviation of the function $b_c$ from the filtered or smoothed function $\underline{b}_c$ may be included as a term in the target function. The target function may be formed as follows, for example:

$$b = \arg_b \min(\|A \cdot b - m_{targ}\|^2 + \beta^2 \|b\|^2 + \eta_2 \tau) \quad (5)$$

$\eta_2$ is a weighting factor, and t is a vector with the individual elements:

$$\tau_c = \|b_c - \underline{b}_c\| \quad (6)$$

In other words, the individual elements $\tau_c$ are deviations of the optimized voltage functions $b_c$ obtained in the second pass from the optimized and filtered voltage functions $\underline{b}_c$ for the individual transmit channels c obtained in the first pass. Within the HF pulse optimization as a whole, multichannel pulse trains are found, with which the desired target function may be achieved. The curvature behavior of the voltage curves of the individual HF-pulse trains is influenced so that the individual HF-pulse trains may also be emitted with the available hardware.

Figure 2:
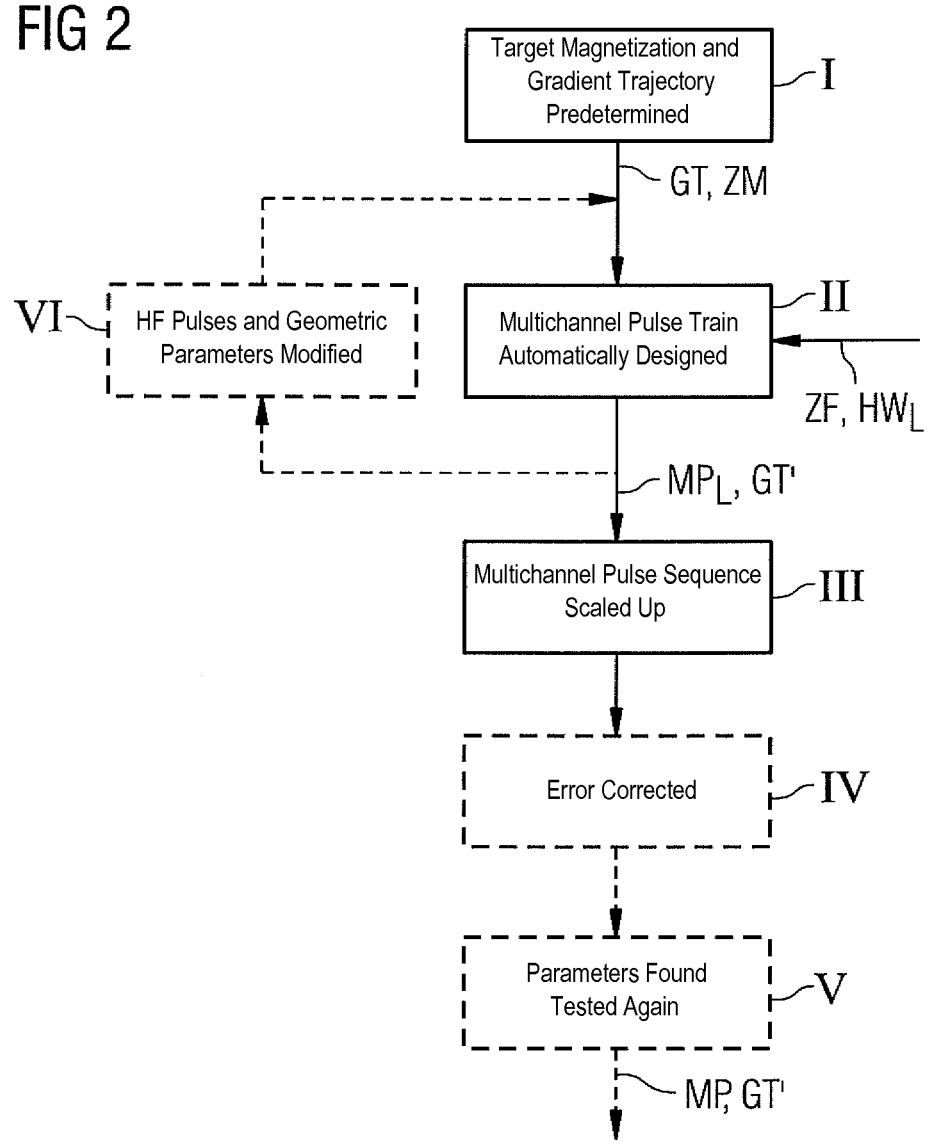
FIG. 2 shows a flow diagram of one embodiment of a method for determining a magnetic resonance system activation sequence.

FIG. 2 shows a further optional variant indicated by the method act VI. The method act VI is associated with the method act II in an iterative loop.

In this variant, the gradient trajectory GT is predetermined in act I in a form, in which a geometry of the gradient trajectory GT may still be modified (e.g., only an initial basic geometry is predetermined). As a simple example, it is assumed in the following that the initially predetermined gradient trajectory GT is a spiral in the k-space in an x/y plane. This extended spiral is defined by the following function:

$$k = r(t, n_1, n_2) \cdot e^{(-2\pi i m_0)} \quad (7)$$

$r(t, n_1, n_2)$ is the radius of the spiral at time t, and $n_0$ is the number of points on the spiral. The two variables $n_1$ and $n_2$ are the parameters that may be varied in the context of the optimization method to be able to optimize the gradient trajectory with respect to minimizing the HF load for the patient. With the initial geometry, the variables $n_1$ and $n_2$ may both be set as equal to 0.33 (e.g., radius r increases in a linear manner so that the spiral is an Archimedes spiral).

Within an iterative method in act VI, the HF pulses and the geometric parameters of the gradient trajectory are modified. The HF pulses and the geometric parameters are included in the actual magnetization $m_{act}$ in the target function. For each iteration loop, the HF pulse train $b_c(t)$ is recalculated as described above.

Since within the context of an optimization method an interaction is always present between the HF pulse trains and the gradient trajectory, to achieve a certain target magnetization, modification of the gradient trajectory (e.g., variation of the gradient parameters) also provides that the curvature may be influenced, for example, indirectly in the target function. For example, in the context of the iteration, the geometry of the gradient trajectory in the k-space may be modified. The gradient trajectory, for example, still has the basic form of a spiral. However, the geometric parameters $n_1$, $n_2$ may be modified so that the spiral is covered in roughly the same region as before optimization, and the image quality has not changed significantly. HF energy is to be deposited at different points from before, and the curve form of the high-frequency pulses is influenced to "equalize" the curve form to some degree.

In one embodiment, time parameters of the gradient trajectory may be modified. For example, the form of the gradient trajectory may be maintained, but a sub-sampling in the same time grid may take place at the points where significant curvature changes in the HF pulses, for example, are visible. If, instead of passing through two different points in one ms on a geometrically identical curve, four intermediate points are now passed through in one ms, for example, a local delay occurs in the k-space that also provides that the curvature of the voltage curves of the HF pulses becomes smaller.

The abovementioned methods may be employed in parallel in order to achieve optimum HF pulses. It is also possible just to perform some of the optimization methods, for example, just to modify the gradient trajectories or just to directly manipulate the pulse shape by modifying the target function according to the equations (3) and/or (5). If optimization of the gradient trajectories also takes place after act II at the end of the optimization method, the multichannel pulse sequences $MP_L$ obtained for the low flip region and an optimized gradient trajectory GT' are present.

FIG. 6 shows two voltage curves $SK_1$, $SK_2$ in the upper diagram, the two voltage curves $SK_1$, $SK_2$ having been optimized with respect to curvature behavior. In the second diagram from the top, the associated phase position is shown, and in the diagrams below, the different gradient pulses are each shown. FIG. 6 shows that the individual pulse shapes are smoothed to a much greater degree with respect to a voltage profile. The phase behavior is also much more equalized.

The gradients $G_{PE}$, $G_{RO}$ are also somewhat attenuated. If the thus modified pulse trains are now emitted via the individual transmit channels of the magnetic resonance transmit facility, the excitation shown on the right side of FIG. 5 results in the phantom. A comparison with the excitation on the left side of FIG. 5, which shows the magnetization achieved with excitation with the pulses according to FIG. 4 before optimization with respect to the curvature behavior of the voltage profiles of the HF pulses, clarifies the effect of the present embodiments. For example, a comparison with the simulated excitation in the diagram on the right side of FIG. 3 shows that a magnetic resonance system activation sequence that results, in mathematical theory, in an optimum target magnetization and produces the desired result with an emission using magnetic resonance systems with standard transmit components may be generated.

In the examples set out above, only the curvature behavior of the voltage functions of the individual high-frequency pulses is taken into account. Another limiting operating parameter of the standard transmit hardware components is a bandwidth restriction. In other words, not all frequencies may be emitted, but the power amplifiers of the individual transmit channels may be restricted in an upward direction with respect to emittable frequencies.

Figure 7:
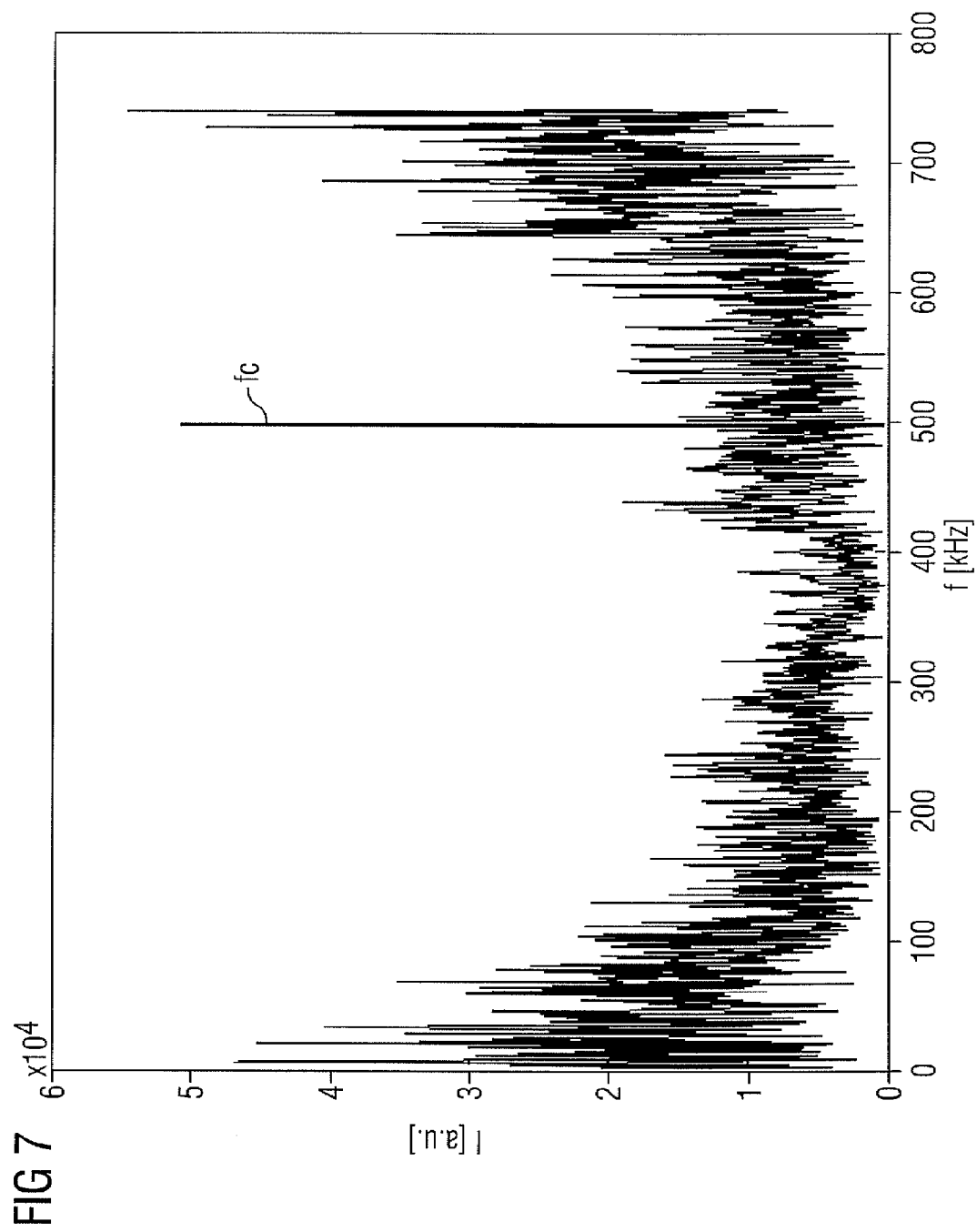
FIG. 7 shows an illustration of the Fourier transformation of the excitation pulses according to FIG. 2 and the limit frequency defined by the bandwidth of the transmit facility.

FIG. 7 shows the Fourier transformed of the two high-frequency pulses according to FIG. 4, with the pulse intensities being indicated in arbitrary units (a.u.) over the frequency in kHz. Also marked at 500 kHz is a limit frequency $f_c$, above which the HF transmit facility is no longer able to emit the frequencies. High-frequency pulses that also contain frequencies f that are above the limit frequency $f_c$ may not be generated within the optimization method. To avoid this, the target function may be modified in the context of the optimization method such that frequencies above the limit frequency $f_c$ are suppressed, for example, in the form $$b = \arg_b \min\left(\|A \cdot b - m_{targ}\|^2 + \beta^2 \|b\|^2 + \eta_1 \kappa + \nu \sum_{f > f_c} |f|\right) \quad (7)$$

$\nu$ is a weighting factor, and f is all frequencies of the frequency spectrum of the high-frequency pulses that are greater than the limit frequency $f_c$ of the transmit hardware. In equation (7), the target function corresponds essentially to the target function from equation (3) but with an additional factor that suppresses pulse trains with frequencies f in the Fourier space that are above the limit frequency $f_c$ of the hardware during optimization.

With all the target functions described above, the individual weighting factors $\eta_1$, $\eta_2$, $\nu$ may each assume values between $10^{-4}$ and $10^4$, for example. The suitable selection of values is a function of the units, optimization methods and relationships between the variables.

The above example shows how, in a simple manner, the method of the present embodiments allows excellent results to be obtained with respect to achieving target magnetization even without costly optimization of hardware transmit components.

With the optimization methods, any further parameters that may also be used, for example, in the target functions described above may be taken into account. For example, the high-frequency load (e.g., specific absorption rate (SAR) load) on the patient may be taken into account by, for example, including function terms that represent the local load on the patient at certain points in the body (e.g., in particularly loaded hot spots) in the target function for optimization. A global load value for high-frequency load may be taken into account within the optimization method. For example, the gradient trajectories may be optimized with respect to load. A wide range of methods for reducing the high-frequency load (e.g., the SAR load on the patient) is described in DE 10 2010 013 672, DE 10 2010 015 066 and DE 10 2010 015 044. Reference is made to these publications, in which procedures used within the optimization method to permit a reduction of the SAR load are described in detail (e.g., adding additional terms to the target function and/or influencing geometric parameters of the gradient trajectory).

The detailed methods and structures described above are exemplary embodiments, and the basic principle may also be varied to a large degree by the person skilled in the art without departing from the scope of the invention, as predetermined by the claims. The use of the indefinite article "a" or "an" does not provide that the relevant features may not also be present in multiple form. The term "unit" does not exclude a number of components that may, in some instances, also be distributed spatially.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a magnetic resonance system activation sequence that comprises a multichannel pulse train with a plurality of individual high frequency (HF) pulse trains to be emitted by the magnetic resonance system by way of different independent HF transmit channels of a transmit device in a parallel manner, the method comprising:
   identifying a k-space gradient trajectory;
   calculating, by a processor, the multichannel pulse train based on the k-space gradient trajectory and a predetermined target magnetization using an HF pulse optimization method; and
   storing the calculated multichannel pulse train in a memory or controlling the transmit device based on the calculated multichannel pulse train,
   wherein the HF pulse optimization method optimization of the multichannel pulse train, the k-space gradient trajectory, or the multichannel pulse train and the k-space gradient trajectory takes account of at least one hardware operating parameter of the transmit device.

2. The method as claimed in claim 1, wherein optimization takes place with respect to curvature of a voltage curve of an HF pulse train of the plurality of individual HF pulse trains, a bandwidth of a Fourier-transformed HF pulse train, or the curvature of the voltage curve of the HF pulse train of the plurality of individual HF pulse trains and the bandwidth of the Fourier-transformed HF pulse train.

3. The method as claimed in claim 2, wherein a target function used within the HF pulse optimization method is predetermined, the target function comprising at least one function term that takes account of the at least one hardware operating parameter of the transmit device.

4. The method as claimed in claim 2, wherein the optimization takes account of a basic condition that corresponds to a limitation of the at least one hardware operating parameter of the transmit device.

5. The method as claimed in claim 2, wherein calculating the multichannel pulse train comprises calculating the multichannel pulse train in the context of the HF pulse optimization method for a lower target magnetization, the calculated multichannel pulse train being scaled up to a final target magnetization.

6. The method as claimed in claim 2, wherein the HF pulse optimization method optimization comprises optimizing the multichannel pulse train, the k-space gradient trajectory, or the multichannel pulse train and the k-space gradient trajectory with respect to an HF load value for an examination object.

7. The method as claimed in claim 1, wherein a target function used within the HF pulse optimization method is predetermined, the target function comprising at least one function term that takes account of the at least one hardware operating parameter of the transmit device.

8. The method as claimed in claim 7, wherein the optimization takes account of a basic condition that corresponds to a limitation of the at least one hardware operating parameter of the transmit device.

9. The method as claimed in claim 7, wherein geometric parameters of the k-space gradient trajectory are varied in the HF pulse optimization method.

10. The method as claimed in claim 1, wherein the optimization takes account of a basic condition that corresponds to a limitation of the at least one hardware operating parameter of the transmit device.

11. The method as claimed in claim 10, wherein time parameters of the k-space gradient trajectory are varied in the HF pulse optimization method.

12. The method as claimed in claim 1, wherein geometric parameters of the k-space gradient trajectory are varied in the HF pulse optimization method.

13. The method as claimed in claim 1, wherein time parameters of the k-space gradient trajectory are varied in the HF pulse optimization method.

14. The method as claimed in claim 1, wherein calculating the multichannel pulse train comprises:
   determining the multichannel pulse train for a given k-space gradient trajectory using the HF pulse optimization method;
   varying parameters of the given k-space gradient trajectory according to a predetermined optimization strategy; and
   repeating the determining and the varying with the varied k-space gradient trajectory until a termination criterion is reached.

15. The method as claimed in claim 1, wherein calculating the multichannel pulse train comprises calculating the multichannel pulse train in the context of the HF pulse optimization method for a lower target magnetization, the calculated multichannel pulse train being scaled up to a final target magnetization.

16. The method as claimed in claim 1, wherein the HF pulse optimization method optimization comprises optimizing the multichannel pulse train, the k-space gradient trajectory, or the multichannel pulse train and the k-space gradient trajectory with respect to an HF load value for an examination object.

17. A method for operating a magnetic resonance system with a plurality of independent high-frequency (HF) transmit channels, the method comprising:
   determining a magnetic resonance system activation sequence that comprises a multichannel pulse train with a plurality of individual HF pulse trains to be emitted by the magnetic resonance system by way of the plurality of independent HF transmit channels in a parallel manner, the determining comprising:
   identifying a k-space gradient trajectory; and
   calculating the multichannel pulse train based on the k-space gradient trajectory and a predetermined target magnetization using an HF pulse optimization method; and
   controlling a transmit device of the magnetic resonance system based on the calculated multichannel pulse train,
   wherein the HF pulse optimization method optimization of the multichannel pulse train, the k-space gradient trajectory, or the multichannel pulse train and the k-space gradient trajectory takes account of at least one hardware operating parameter of the transmit device; and operating the magnetic resonance system using the magnetic resonance system activation sequence.

18. A control sequence determination system for determining a magnetic resonance system activation sequence that comprises a multichannel pulse train with a plurality of individual high frequency (HF) pulse trains to be emitted by a magnetic resonance system by way of different independent high-frequency transmit channels of a transmit device in a parallel manner, the control sequence determination system comprising:

an input interface configured for detecting a k-space gradient trajectory and a target magnetization;

an HF-pulse optimization unit operable to communicate with the input interface and configured to calculate the multichannel pulse train based on the detected k-space gradient trajectory and a predetermined target magnetization using an HF pulse optimization method; and a control sequence output interface operable to communicate with the HF-pulse optimization unit, wherein the HF pulse optimization unit is configured to optimize, in the HF pulse optimization method, the multichannel pulse train, the k-space gradient trajectory, or the multichannel pulse train and the k-space gradient trajectory taking account of at least one hardware operating parameter of the transmit device.

19. The control sequence determination system as claimed in claim 18, wherein the control sequence output interface is configured to transmit the magnetic resonance system activation sequence to a controller of the magnetic resonance system.

20. A magnetic resonance system comprising:

a transmit device with a plurality of independent high-frequency (HF) transmit channels;

a gradient system; and a control device that is in communication with the transmit device and the gradient system and is configured to:

emit a multichannel pulse train with a plurality of parallel individual HF pulse trains by way of the plurality of independent HF transmit channels to perform a desired measurement based on a predetermined activation sequence; and emit a gradient pulse train in a manner coordinated to the multichannel pulse train by way of the gradient system; and a control sequence determination device configured to determine an activation sequence and transmit the activation sequence to the control device, the control sequence determination device comprising:

an input interface configured for detecting a k-space gradient trajectory and a target magnetization;

an HF-pulse optimization unit operable to communicate with the input interface and configured to calculate the multichannel pulse train based on the k-space gradient trajectory and a predetermined target magnetization using an HF pulse optimization method; and a control sequence output interface operable to communicate with the HF-pulse optimization unit, wherein the HF pulse optimization unit is configured to optimize, in the HF pulse optimization method, the multichannel pulse train, the k-space gradient trajectory, or the multichannel pulse train and the k-space gradient trajectory taking account of at least one hardware operating parameter of the transmit device.

21. A non-transitory storage medium having stored therein a computer program that is loadable directly into a memory of a control sequence determination system with program code segments including instructions executable by a processor to determine a magnetic resonance system activation sequence that comprises a multichannel pulse train with a plurality of individual high frequency (HF) pulse trains to be emitted by a magnetic resonance system by way of different independent HF transmit channels of a transmit device in a parallel manner, when the program is run in the control sequence determination system, the instructions comprising:

identifying a k-space gradient trajectory; and calculating the multichannel pulse train based on a k-space gradient trajectory and a predetermined target magnetization using an HF pulse optimization method;

storing the calculated multichannel pulse train in a memory or controlling the transmit device based on the calculated multichannel pulse train, wherein the HF pulse optimization method optimization of the multichannel pulse train, the k-space gradient trajectory, or the multichannel pulse train and the k-space gradient trajectory takes account of at least one hardware operating parameter of the transmit device.

* * * * *